United States Patent [19]
Maeda et al.

[11] 3,979,241
[45] Sept. 7, 1976

[54] METHOD OF ETCHING FILMS OF SILICON NITRIDE AND SILICON DIOXIDE

[75] Inventors: Kazuo Maeda, Chigasaki; Bunya Matsui, Kawasaki, both of Japan

[73] Assignee: Fujitsu Ltd., Kawasaki, Japan

[22] Filed: Mar. 29, 1973

[21] Appl. No.: 346,095

Related U.S. Application Data

[63] Continuation of Ser. No. 887,575, Dec. 23, 1969, abandoned.

[30] Foreign Application Priority Data
Dec. 28, 1968 Japan................................. 44-44177

[52] U.S. Cl.................................. 156/13; 156/11; 156/17; 252/79.3; 252/79.4
[51] Int. Cl.²................ H01L 21/302; H01L 21/316

[58] Field of Search ............ 252/79.3, 79.4; 156/11, 156/17, 8, 13; 134/10

[56] References Cited
UNITED STATES PATENTS

| | | | |
|---|---|---|---|
| 3,434,896 | 3/1969 | Chance et al......................... | 156/17 |
| 3,518,135 | 6/1970 | Cerniglia et al. ..................... | 156/17 |
| 3,607,480 | 9/1971 | Harrap et al.......................... | 156/17 |
| 3,709,749 | 1/1973 | Sato et al............................. | 156/11 |

*Primary Examiner*—Charles E. Van Horn
*Assistant Examiner*—Jerome W. Massie
*Attorney, Agent, or Firm*—Herbert L. Lerner

[57] ABSTRACT

An etching liquid comprises ammonium fluoride or alkali fluoride dissolved in a polyvalent or higher alcohol.

4 Claims, 3 Drawing Figures

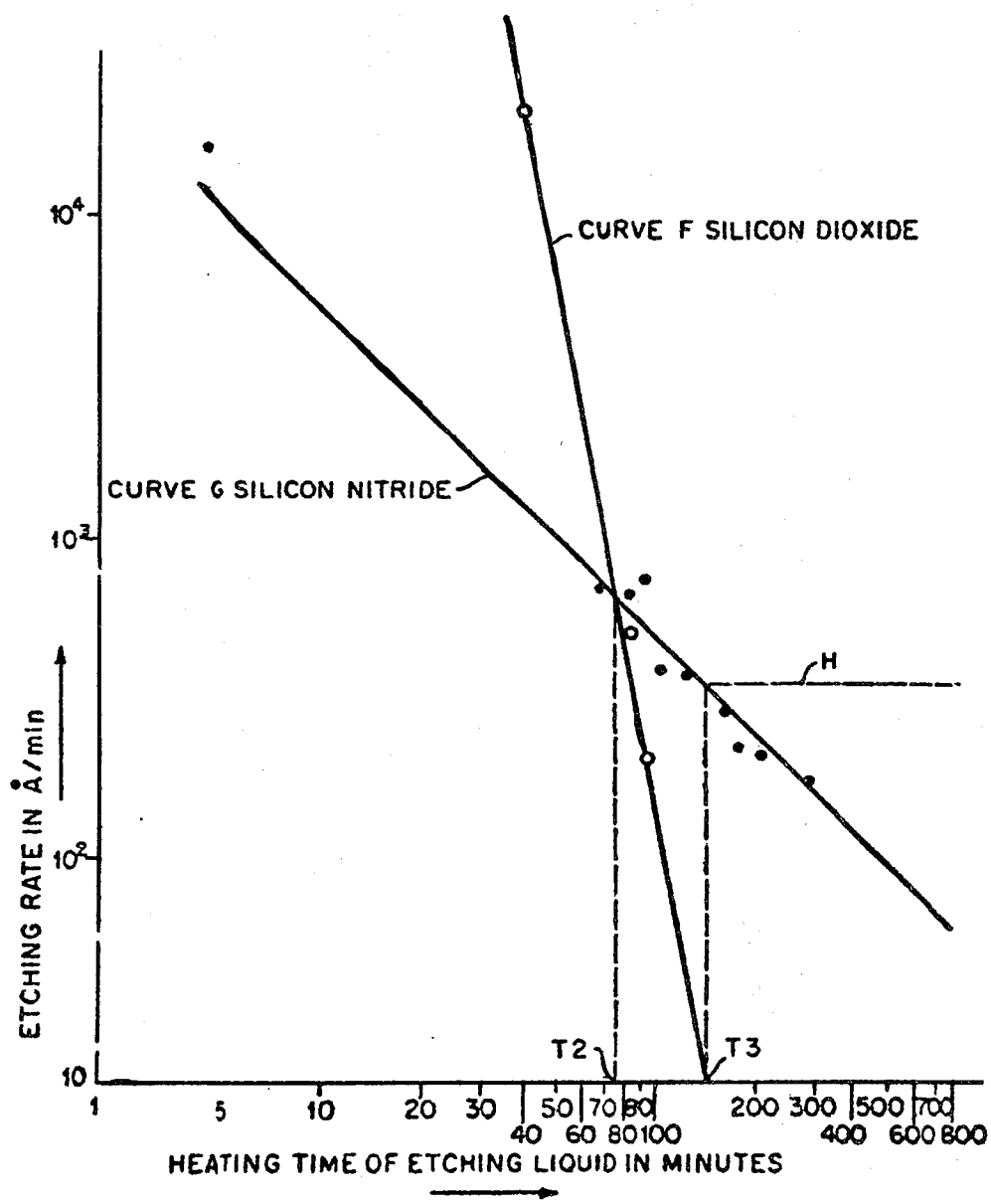

METHOD OF ETCHING FILMS OF SILICON NITRIDE AND SILICON DIOXIDE

This is a continuation of application, Ser. No. 887,575, filed Dec. 23, 1969 now abandoned.

DESCRIPTION OF THE INVENTION

The invention relates to the etching of films. More particularly, the invention relates to a method of etching films for semiconductors. The method of the invention for etching films permits the selective etching of insulating film or metal film with stability.

The etching technique in the manufacture of semiconductor devices generally includes an etching technique for metal films and is as important as the gaseous phase growth technique for forming insulating films and semiconductor thin films. The conventional etching method, which has not been precise enough, has been an obstruction to miniaturization of semiconductor devices.

Semiconductors, such as silicon and germanium, may be etched by a solution of a mixture of hydrogen fluoride and nitric acid in water. Silicon dioxide films may be etched by a buffer solution including hydrogen fluoride. Silicon nitride films may be etched by boiling phosphoric acid. Metals, such as aluminum, may be etched by various types of acids and alkalis. Silicon nitride films are now utilized in the manufacture of semiconductor devices. This is due to the electrical and chemical stability of the silicon nitride films and their ability for the precise masking of impurities. The silicon nitride film may be selectively etched by boiling phosphoric acid utilizing a silicon dioxide film as a mask. This is not complete, however.

Etching fluids or liquids other than phosphoric acid are mostly aqueous solutions and have considerable limitations in composition and pH. Such liquids cannot be produced with facility and have very low reproducibility. Aluminum, which is widely utilized as the conductive pattern of a semiconductor device, is eroded by acid and alkali, so that there is noticeable difficulty in opening apertures, or the like, in the insulating film of multilayer wiring. In general, each of the etching liquids may etch only a single type of film and is unable to etch other types of film.

The principal object of the invention is to provide a new and improved method of etching films for semiconductors.

An object of the invention is to provide a method of etching only an oxide film and a nitride film without eroding the semiconductor, with a solution of one composition, or selectively etching a nitride film utilizing an oxide film as a mask.

An object of the invention is to provide a method of etching films for semiconductors by the utilization of an etching liquid which is capable of etching an oxide film and a nitride film without eroding aluminum, and is capable of etching a nitride film utilizing an oxide film as a mask.

An object of the invention is to provide a method of etching films for semiconductors by the utilization of an etching liquid which may be produced with facility and which has no limitations in composition of pH, which is usable semi-permanently and which has stability.

An object of the invention is to provide a method of etching films for semiconductors which is efficient, precise, effective and reliable.

An object of the invention is to provide a new and improved etching liquid.

An object of the invention is to provide an etching liquid which may be produced with facility, has no limitations in composition or pH, is usable semi-permanently, and has stability.

In accordance with the invention, an etching liquid for etching films for semiconductors comprises one of the group consisting of ammonium fluoride and alkali fluoride dissolved in a polyvalent alcohol.

The one of the group may be dissolved in a higher alcohol in amounts of 2 to 50% by weight of the total solution of ammonium fluoride or 5 to 50% by weight of the total solution of alkali fluoride. The alcohol is one of the group consisting of ethylene glycol, polyethylene glycol, glycerin, polyethylene, polymethylene glycol, ethylene chlorohydrin; dioxane pinacol and ethylene glycol monomethyl ether.

In accordance with the invention, the method of etching films for semiconductors comprises dissolving one of a group consisting of ammonium fluoride and alkali fluoride in a polyvalent alcohol or a higher alcohol to produce an etching liquid.

The method further comprises heating the etching liquid, etching a film of silicon dioxide and a film of silicon nitride in the etching liquid, and reversing the etching rate of silicon dioxide and silicon nitride to etch the silicon dioxide and the silicon nitride without eroding the silicon dioxide film.

The method further comprises heating the etching liquid, immersing aluminum in the etching liquid and etching a film of silicon dioxide and a film of silicon nitride in the etching liquid before the etching rate of the silicon dioxide and the silicon nitride become equal to each other without eroding the aluminum.

The method further comprises heating the etching liquid, applying one of a silicon dioxide and silicon nitride film to an alumina film as a mask and etching the masked alumina film in the etching liquid before the etching rate of the silicon dioxide and the silicon nitride become equal to each other.

In order that the invention may be readily carried into effect, it will now be described with reference to the accompanying drawings, wherein:

FIG. 3 is a graphical presentation illustrating the relation between the heating time of the etching liquid and the etching rate of silicon dioxide and silicon nitride.

In accordance with the invention, etching liquid or etchant is produced by dissolving ammonium fluoride or alkali fluoride in a polyvalent alcohol or higher alcohol. When the etching liquid of the invention is heated for a designated period of time at 200° to 300°C, the etching rate of silicon dioxide and silicon nitride in the etching liquid varies as shown in FIG. 1.

Figure 1:
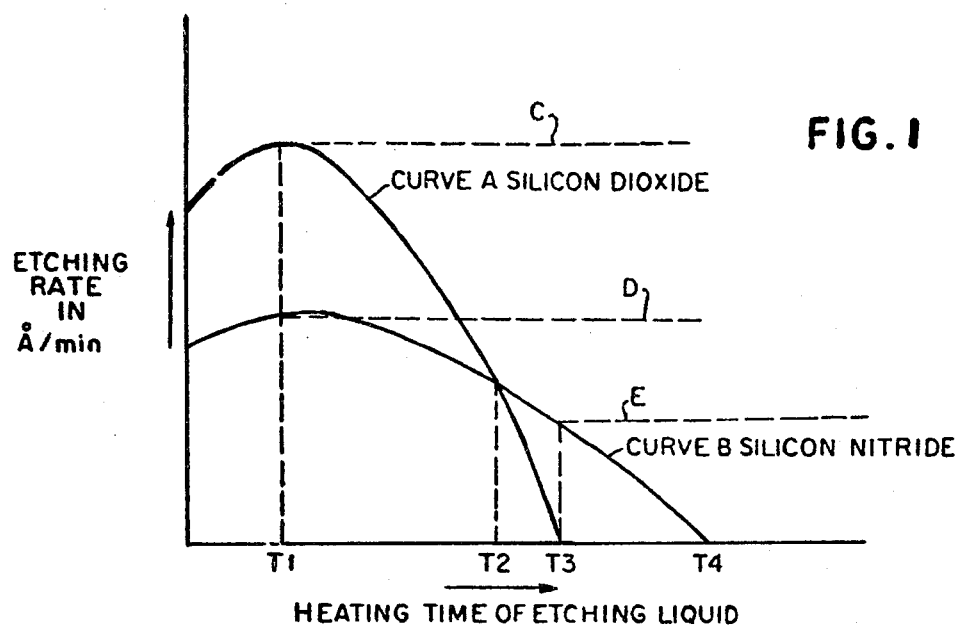
FIG. 1 is a graphical presentation illustrating the relation between the heating time of the etching liquid of the invention and the etching rate.

In FIG. 1, the abscissa represents the heating time of the etching liquid on a logarithmic scale. The ordinate represents the etching rate on a logarithmic scale. The etching liquid is heated at a constant temperature, permitting the evaportion of the solvent to a certain extent. Curve A illustrates the etching rate of silicon dioxide and curve B illustrates the etching rate of silicon nitride.

Prior to the time T2, at which the etching rate of silicon dioxide and the etching rate of silicon nitride are equal, these films may be etched at a very high rate. After the time T2, however, the etching rates of silicon dioxide and silicon nitride are reversed, and only the silicon nitride film may be etched. The time T2 becomes long if the concentration of the fluoride increases and becomes short if the heating temperature becomes high.

The etching rate of the silicon dioxide film becomes zero at the time T3 and the etching rate of the silicon nitride film becomes zero at the time T4. This means that it is possible to etch selectively the silicon nitride film without eroding the silicon dioxide film in the period between the time T3 and the time T4. We have thus found that the etching rates of the silicon dioxide film and the silicon nitride film are reversed during the etching process in an etching liquid of our invention, which includes ammonium fluoride or alkali fluoride as the solute. This phenomenon has not been observed in the conventional etching liquids.

When a silicon nitride film is selectively etched between the time T3 and the time T4 with an etching liquid which includes a solute of ammonium fluoride, the percentage by weight of the ammonium fluoride must be greater than 2%. When lithium fluoride or sodium fluoride is utilized as the solute, the percentage by weight must be greater than 5%. The preferable range of ammonium fluoride is 2 to 50% by weight of the total solution and the preferable range of alkali fluoride is 5 to 50% by weight of the total solution. Aluminum is not etched before the time T2, so that if apertures, windows, or the like, are opened in the insulating film prior to the time T2, over-etching of aluminum during the process of opening apertures, windows, or the like in multilayer wiring may be prevented.

Aluminum is etched after the time T2. If it is arranged for the aluminum to be etched after the time T4, however, it becomes possible to etch only the aluminum without eroding the insulating film. It should also be noted that the insulating film may be etched without substantially eroding the aluminum. On the other hand, when the etching liquid of the invention is utilized, alumina, $Al_2O_3$, film, formed by the gaseous phase reaction of aluminum chloride with carbon dioxide or nitrogen monoxide, is etched at a rate which is considerably higher than that of silicon dioxide film and silicon nitride film prior to the time T2. It is therefore possible to selectively etch the alumina film utilizing silicon dioxide as a mask. The alumina film cannot be substantially etched by the known solution of fluoric acid or phosphoric acid.

In the aforedescribed method of the invention, it is necessary to heat the etching liquid at a high temperature, permitting evaporation of the solvent in the etching liquid, to obtain the required etching rate. Therefore, the etching liquid may be utilized only once, when the process continues for a long period of time. We have discovered, however, that the designated etching rate may be maintained semipermanently. In accordance with the invention, the designated etching rate may be maintained by refluxing the evaporated material by water cooling when the designated etching rate is reached.

In accordance with FIG. 1, if the flux is started at the time T1, the highest etching rate may be maintained for the silicon dioxide film, as indicated by the broken line C. A high etching rate may be maintained for the silicon nitride film, as indicated by the broken line D. If the flux is at the time T3, only the etching rate of the silicon nitride film may be held semipermanently, as indicated by the broken line E. When the flux is at the time T1, only the silicon dioxide film may be substantially etched, since said film may be etched at an etchng rate which is so high that the ordinary etching rate is negligible by comparison. When the flux is at the time T3, only the silicon nitride film may be etched at a high etching rate, and the silicon dioxide film is not etched at all.

Selective etching of the silicon nitride film, which is more complete than etching utilizing phosphoric acid, may thus be provided by utilizing a silicon oxide or silicon dioxide film as a mask. It is not clear by what chemical mechanism such special phenomenon occurs in the etching liquid of the invention. It is, however, a considerable improvement over known methods, that an arbitrary condition may be maintained semipermanently by flux of the evaporated material.

The solvent for the etching liquid of the invention is a polyvalent alcohol or a higher alcohol such as, for example, ethylene glycol, polyethylene glycol, glycerin, polyethylene, polymethylene glycol, ethylene chlorohydrin, dioxane pinacol, or ethylene glycol monomethyl ether. These alcohols, in general, have boiling points of greater than 100°C. Alcohols which are solids at normal temperatures have melting points of less than 200° to 300°C and are all chemically stable at the boiling point or melting point.

EXAMPLE 1

Figure 2:
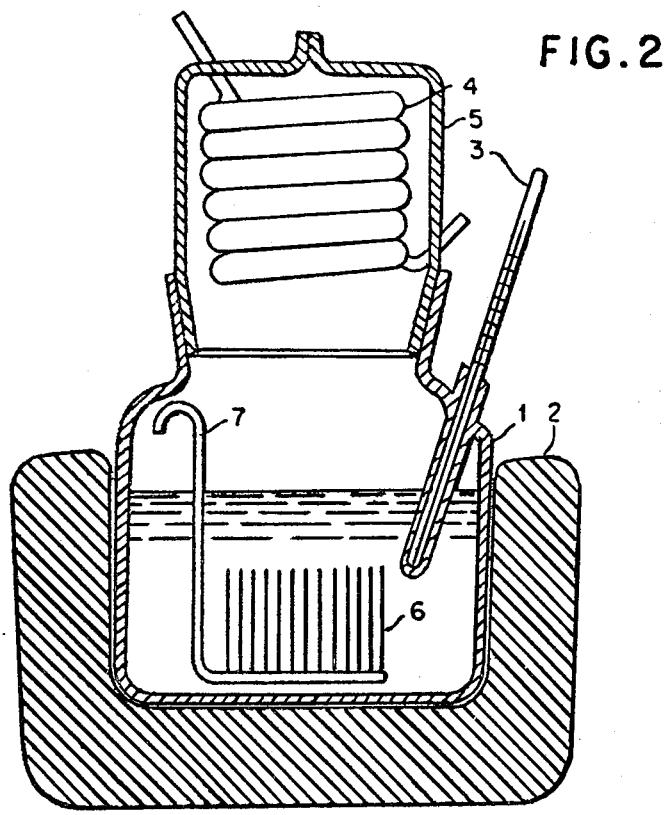
FIG. 2 is a schematic diagram, partly in section, of an embodiment of etching apparatus for providing the method of the invention.

Glycerin is provided in an alumina beaker 1, as shown in FIG. 2. Ammonium fluoride of 10% by weight of the total solution is added. The ammonium fluoride in amounts is melted by heating by any suitable means such as, for example, a mantle heater 2. Glycerin has a boiling point of 290°C. Ammonium fluoride in glycerin is mostly dissolved at 120°C, the liquid is heated continuously until the designated termperature of 250°C is reached. The temperature is then maintained at 250°C. The temperature is checked by a thermometer 3 which is supported in a holder extending into the solution in the beaker 1.

Without a cover 5, the liquid in the beaker 1 is evaporated. The cover 5 includes a water-cooled tube 4 mounted therein. When the cover 5 is not on the beaker 1, the relation between the heating time in minutes, as shown by the abscissa, and the etching rate in A/minute, as indicated by the ordinate, is shown in FIG. 3. In FIG. 3, curve F illustrates the etching rate of silicon dioxide film and curve G illustrates the etching rate of silicon nitride film. The silicon dioxide film was formed by heating a silicon substrate in steam at 1200°C. The silicon nitride film was formed by the gaseous phase reaction of monosilane and ammonia on a silicon substrate at 860°C.

As shown in FIG. 3, the curves F and G intersect each other at the time T2, whihc is 78 minutes. Etching of the silicon dioxide film is completely stopped at the time T3, which is 140 minutes. Before the time T2, the alumina film, formed by the gaseous phase reaction of aluminum chloride with carbon dioxide or nitrogen monoxide on the silicon, has an etching rate considerably higher than that of the silicon dioxide film. Thus, for example, at 50 minutes, the silicon dioxide film has an etching rate of 2 times $10^4$ A/minute whereas the alumina film has an etching rate of 5 times $10^5$ A/minute.

The surface of the aluminum film evaporated on the silicon substrate is very slightly etched but not markedly so, by the etching treatment between the instant that the etching rate of the silicon dioxide film becomes a maximum and the time T2. After the time T2, however, the aluminum film is rapidly etched. In an experiment not shown in the FIGS., when the etching rate of the silicon dioxide film was 3 times $10^4$ A/minute and the etching rate of the silicon nitride film was 2 times $10^3$ A/minute, the aluminum was scarcely etched. At 210 minutes, however, the etching rate of the aluminum was $10^4$ A/minute, while the etching rate of the silicon dioxide film was zero, and the etching rate of the silicon nitride film was 200 A/minute. The etching rate of silicon itself may amount to only 100 A/minute even when the temperature of the liquid is 350°C.

As shown in FIG. 2, a pllurality of substrates 6 are immersed in the etching liquid. The substrates 6 are supported on the holder 7 which is immersed in the etching liquid. When the beaker 1 is closed by the cover 5, and water is circulated through the water-cooled tube 4 in said cover, the etching liquid is flux at the designated time and the etching condition at said designated time may be maintained. Thus, for example, if flux of the etching liquid is commenced at the time T3, the etching rate of the silicon dioxide film is zero, maintaining the etching rate at said time, and the etching rate of the silicon nitride film is maintained at the level of the broken line H (FIG. 3), thereby nearly maintaining the etching rate at said time.

The etching liquid may maintain its condition at the time T3 even if it is once heated or cooled and then heated again to the designated etching temperature. When the etching process is performed in a short period of time, of course, it is unnecessary to flux the etching liquid. In such case, the etching liquid is cooled after the etching process and is heated again at the time of its next use. The same etching liquid may thus be utilized an arbitrary number of times.

EXAMPLE 2

As in Example 1, 90 grams of glycerin and 10 grams of ammonium fluoride are provided in an alumina beaker and heated to 140°C. About 200 minutes after the commencement of heating, but prior to the time T2, the silicon dioxide film is etched at 2300 A/minute and the silicon nitride film is etched at 400 A/minute. The silicon dioxide film was formed by thermal oxidation of a silicon substrate at 1200°C in a steam atmosphere. The silicon nitride film was formed by the gaseous phase reaction of monosilane and ammonia on a silicon substrate at 860°C.

EXAMPLE 3

As in Example 1, 95 grams of glycerin and 5 grams of ammonium fluoride are provided in an alumina beaker and are heated to 283°C (FIG. 2). At the time T2, which is approximately 150 minutes after the commencement of heating, the composition of the etching liquid is changed and the etching rate of the silicon dioxide film is zero and the etching rate of the silicon nitride film is 300 A/minute. The silicon dioxide film and the silicon nitride film in Example 3 were formed in the same manner as the film in Example 2.

EXAMPLE 4

As in Example 1, 90 grams of ethylene glycol and 10 grams of ammonium fluoride are provided in an alumina beaker and are heated to 160°C. At the time T2, which is about 140 minutes after the commencement of heating, the composition of the etching liquid is changed and the etching rate of the silicon dioxide film becomes zero and the etching rate of the silicon nitride film becomes 5 A/minute. It may be concluded from the foregoing that the following etching methods are possible in accordance with the method of the invention. A silicon dioxide film and a silicon nitride film may be etched utilizing a photosensitive resin and a liquid temperature of less than 220°C. A silicon dioxide film and a silicon nitride film may be etched without etching an aluminum conductive film before the time T2. A conductive film of aluminum may be etched without etching a silicon dioxide film and a silicon nitride film after the time T3 or T4. An alumina film may be selectively etched utilizing a silicon dioxide film as a mask before the time T2. A silicon nitride film may be selectively etched utilizing a silicon dioxide film as a mask between the times T3 and T4. In this method, it is possible to completely prevent the etching of the silicon dioxide film. The aforementioned etching processes may be accomplished in an etching liquid which is refluxed.

While the invention has been described by means of specific examples and in a specific embodiment, we do not wish to be limited thereto, for obvious modifications will occur to those skilled in the art without departing from the spirit and scope of the invention.

We claim:
1. A method of manufacture of a semiconductor device having a seimconductor substrate, said method comprising the steps of heating an alcohol selected from the group consisting of ethylene glycol, polyethylene glycol, glycerine, polymethylene glycol, ethylene chlorohydrin, pinacol and ethylene glycol monomethyl ether; dissolving ammonium fluoride in the amount of 2 to 50% by weight of the total solution or alkali fluoride in the amount of 5 to 50% by weight of the total solution in the alcohol to produce an etching liquid; forming a layer of silicon nitride on a layer of silicon dioxide in a predetermined pattern on the surface of the substrate; heating the etching liquid until the etching rate of the silicon dioxide becomes lower than that of the silicon nitride; and immersing the substrate and the layers thereon in the etching liquid during heating of the etching liquid to remove silicon nitride and leave silicon dioxide in the predetermined pattern.

2. A method of manufacture of a semiconductor device having a semiconductor substrate, said method comprising the steps of heating an alcohol selected from the group consisting of ethylene glycol, polyethylene glycol, glycerine, polymethylene glycol, ethylene chlorohydrin, pinacol and ethylene glycol monomethyl ether; dissolving ammonium fluoride in the amount of 2 to 50% by weight of the total solution or alkali fluoride in the amount of 5 to 50% by weight of the total solution in the polyvalent alcohol to produce an etching liquid; forming an insulating layer selected from silicon nitride and silicon dioxide on the substrate; forming a window selectively on said insulating layer to expose a part of the surface of said semiconductor substrate; forming an aluminum wiring layer conductively contacting the surface of the semiconductor substrate within said window and extending onto the surface of said insulating layers; forming an upper insulating layer selected from silicon nitride and silicon dioxide on the wiring layer and said insulating layer; forming a mask for producing a window on a desired portion on an aluminum wiring layer of said upper insulating layer; immersing the semiconductor substrate and the layers thereon in the etching liquid while heating the etching liquid for a period of time before the etching rate of silicon dioxide becomes equal to the etching rate of silicon nitride thereby etching an opening through the upper insulating layer to expose the aluminum wiring layer.

3. A method as claimed in claim 1, further comprising the step of refluxing the etching liquid during heating of the etching liquid to maintain the etching rate constant.

4. A method as claimed in claim 2, further comprising the step of refluxing the etching liquid during heating of the etching liquid to maintain the etching rate constant.

* * * * *